United States Patent [19]

Yamamoto et al.

[11] Patent Number: 5,045,791

[45] Date of Patent: Sep. 3, 1991

[54] NUCLEAR MAGNETIC RESONANCE IMAGING METHOD

[75] Inventors: Etsuji Yamamoto, Akishima; Hideki Kohno, Tama, both of Japan

[73] Assignees: Hitachi, Ltd.; Hitachi Medical Corporation, both of Tokyo, Japan

[21] Appl. No.: 492,121

[22] Filed: Mar. 13, 1990

[30] Foreign Application Priority Data

Mar. 15, 1989 [JP] Japan .................. 1-61016

[51] Int. Cl.⁵ .............................. G01B 33/20
[52] U.S. Cl. ...................... 324/309; 324/312
[58] Field of Search ............... 324/300, 307, 309, 310, 324/311, 312, 313, 314, 318, 322; 128/653

[56] References Cited

U.S. PATENT DOCUMENTS 4,506,222 3/1987 Edelstein et al. ................ 324/309
4,707,658 11/1987 Frahm et al. .................... 324/309

Primary Examiner—Michael J. Tokar
Attorney, Agent, or Firm—Antonelli, Terry, Stout & Kraus

[57] ABSTRACT

A three-dimensional NMR imaging method using phase encoding field gradients along two direction is disclosed. The measurement of an NMR signal is repeated in such a manner that among all combinations of a plurality of magnitudes of gradient prepared for the phase encoding field gradient along one of the two directions and a plurality of magnitudes of gradient prepared for the phase encoding field gradient along the other direction, combinations in which the magnitude of the phase encoding field gradient along the one direction is not larger than a predetermined value, are selected preceding the remaining combinations. A first image reconstruction processing is performed for data trains acquired on the basis of the precedently selected combinations, thereby obtaining a crude image. The crude image is displayed to confirm whether the location of measurement is proper or not. After the confirmation, the remaining combinations are successively selected to continue the measurement of the NMR signal and a second image reconstruction processing is performed for all of data trains acquired, thereby obtaining a detailed image.

15 Claims, 3 Drawing Sheets

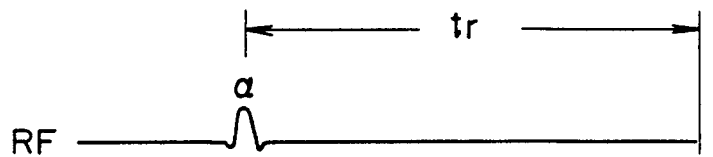
FIG. 3A
FIG. 3B
FIG. 3C
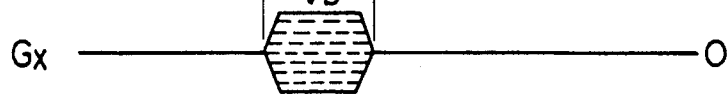
FIG. 3D
FIG. 3E
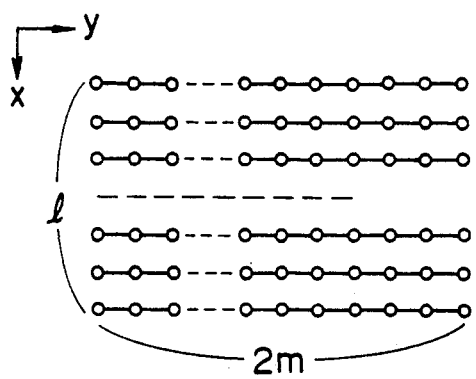
FIG. 4
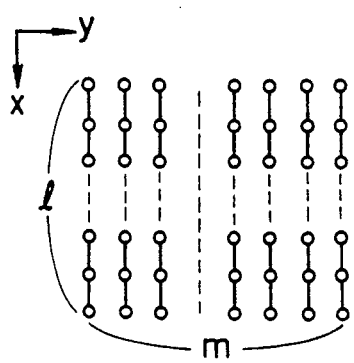
FIG. 5

NUCLEAR MAGNETIC RESONANCE IMAGING METHOD

BACKGROUND OF THE INVENTION

The present invention relates to an imaging method using a nuclear magnetic resonance (hereinafter referred to as NMR) phenomenon, and more particularly to such a method suitable for acquisition of a crude image during or exactly after measurement in a three-dimensional imaging.

In an imaging using an NMR phenomenon, it is necessary to separately identify the signal from an object. According to one of methods which are generally used, a read-out field gradient is applied or a gradient along one direction is provided to the intensity of a static magnetic field during a signal detection period of time to provide a gradient to a resonance frequency. Further, there is well known a method which is used in combination with the above-mentioned method and in which a phase encoding field gradient is applied or a gradient along a second direction is provided in a period of time from the excitation of spins until the detection of a signal to encode the phase of spins with information of the location along the second direction. The basic concept of this method is described by, for example, Journal of Magnetic Resonance, Vol. 18, pp. 69–83 and PCT Patent Application No. GB81/00044 (WO81/02788). The Journal of Magnetic Resonance also describes a three-dimensional imaging in which a phase encoding field gradient along a third direction is further applied.

In an imaging using the above-mentioned phase encode, it is required to repeat the measurement of a signal while changing the encode value (in general, the magnitude of the phase encoding field gradient) by the number of times corresponding to the number of locations to be separately identified. In the three-dimensional imaging in which phase encoding is made for two directions, measurement is repeated with all combinations of a plurality of magnitudes of gradient prepared for a phase encoding field gradient along one of the two directions and a plurality of magnitudes of gradient prepared for a phase encoding field gradient along the other direction.

SUMMARY OF THE INVENTION

For example, when a flash method described by German Patent Application P3504734.8 is used which causes spin excitation at a small flip angle, the repetition of measurement over a multiplicity of times for performing the above-mentioned three-dimensional imaging is completed in about 10 minutes. Further, a time of about 3 to 10 minutes is required for performing Fourier transformation for measurement data trains acquired to reconstruct an image. Namely, even if such a fast imaging technique is used, a time of 10 minutes plus several minutes is required from the start of measurement until the acquisition of an image, which results in corresponding retardation of the judgement of whether various imaging conditions are proper or not.

Accordingly, an object of the present invention is to provide an NMR imaging method which is capable of reconstructing and displaying a crude image during or exactly after measurement, thereby allowing a rapid grasp of the inspection situation.

One feature of the present invention lies in that the order of alterations in magnitude of a phase encoding field gradient is elaborated or properly established to precedently make measurement by a phase encoding field gradient providing information of a low spacial frequency, that is, measurement by relatively small magnitudes among a plurality of magnitudes of gradient prepared for the phase encoding field gradient.

Another feature of the present invention lies in that at the point of time when the measurement by the relatively small magnitudes among the plurality of magnitudes of gradient prepared for the phase encoding field gradient has been finished, an operation for reconstructing a crude image from data trains acquired is started.

A further feature of the present invention lies in that after measurement by successive selection of the plurality of magnitudes of gradient prepared for the phase encoding field gradient has been entirely finished, data corresponding to lower spacial frequency components or data measured by relatively small magnitudes of gradient are selected among data obtained trains acquired to perform a processing for reconstruction of a crude image.

A typical example of the order of alterations in magnitude of the phase encoding field gradient established in the present invention is represented by $$G(k) = \frac{2}{n} G_m (-1)^k \left[ \frac{k}{2} \right] \tag{1}$$

where $G(k)$ is the k-th magnitude of gradient, k satisfying a relation of $1 \leq k \leq n$, $G_m$ is the maximum magnitude of gradient and $[x]$ is the greatest integer which does not exceed x. Namely, the magnitude of gradient or the absolute value of gradient start from zero and becomes gradually large. Other than this typical example may be used a method in which the plurality of magnitudes of gradient prepared for the phase encoding field gradient are classified into a first group including a predetermined magnitude and magnitudes smaller than that (inclusive of zero) and a second group including magnitudes larger than the predetermined magnitude and the magnitudes of gradient in the first group are selected preceding the magnitudes of gradient in the second group.

More especially, in an imaging in which phase encoding field gradients along two directions are applied in combination thereof (for example, a three-dimensional imaging), a series of measurements are performed selecting continually one of magnitudes of gradient prepared for a phase encoding field gradient along a first direction while selecting successively a plurality of magnitudes of gradient prepared for a phase encoding field gradient along a second direction, and the subsequent measurement is repeated with successive combination of each of the magnitudes of gradient prepare for the phase encoding field gradient along the first direction and the plurality of magnitudes of gradient prepared for the phase encoding field gradient along the second direction. In this case, the above-mentioned order of alterations in magnitude of gradient characteristic of the present invention is employed for the phase encoding field gradient along the first direction. In the three-dimensional imaging, information of the location along one of three directions involving the smallest number of pixels is provided by applying the first encoding field gradient at the specified order of alterations in magnitude.

If measurement is made with the precedent selection of relatively small magnitudes of gradient among the plurality of magnitudes of gradient prepared for the phase encoding field gradient, as mentioned above, it is possible to reconstruct an image prior to the completion of the repetition of measurement by performing Fourier transformation for data trains acquired in the course of the repetition of measurement. The reconstructed image is a crude image lacking high frequency components of the spacial frequency but it is sufficiently effective for confirmation or judgement of whether a measurement condition such as the location of measurement is proper or not. Accordingly, in the case where the measurement condition is not proper, it is possible to re-establish the measurement condition with interruption of measurement before the overall measurement has been completed.

The order of alterations following the above equation (1) provides data in which spacial frequency components gradually increased in frequency from a lower one toward a higher one are subsequently added. Accordingly, image reconstruction based on data acquired in the course of measurement or before the completion of the overall measurement may be started at any proper point of time, taking a required speed and a required resolution into consideration.

Also, even after the repetitive measurement by the plurality of magnitudes of gradient prepared for the phase encoding field gradient has been entirely completed, a crude image can be obtained, in a short time as compared with a time required in the case of the use of all of data acquired, by selecting only data containing information of lower spacial frequency components or data measured by relatively small magnitudes of gradient for the phase encoding field gradient and performing a image reconstruction processing based on the selected data prior to execution of an image reconstruction processing using all of the data acquired. This shortened image reconstruction processing is effective, especially in the three dimensional imaging which Fourier transformation is carried out multiple times for the image reconstruction processing.

BRIEF DESCRIPTION OF THE DRAWINGS

FIGS. 3A, 3B, 3C, 3D and 3E represent waveforms showing a measurement sequence used in the embodiment of the present invention;

FIGS. 4, 5 and 6 are conceptual views showing an image reconstructioning processing performed in the embodiment of the present invention.

DESCRIPTION OF THE PREFERRED EMBODIMENTS

Figure 2:
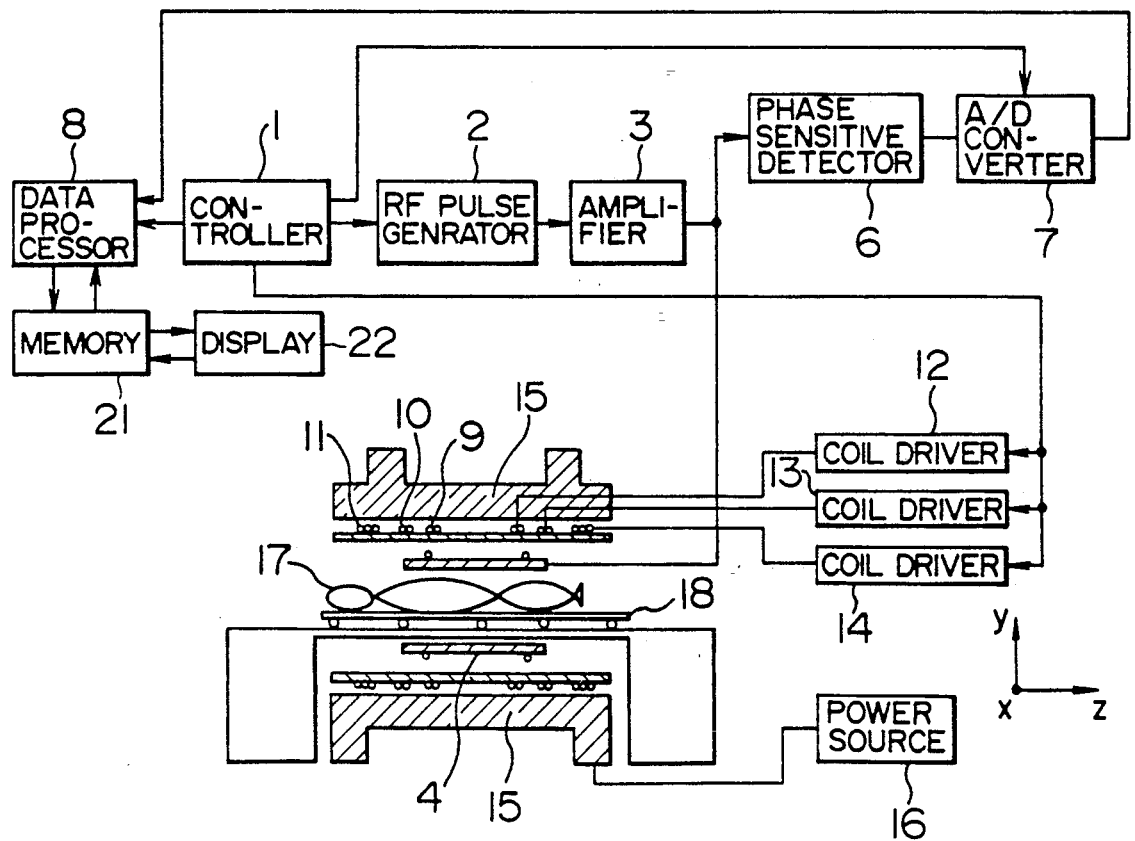
FIG. 2 is a block diagram of a system for embodying the present invention.

FIG. 2 shows a block diagram of an inspection system which uses an NMR phenomenon and embodies the present invention. In the figure, an electromagnet 15 is supplied with an electric current from a power source 16 to generate a uniform static magnetic field in a z direction is generated within a space inside of the magnet. In the case where the electromagnet 15 is constructed by a superconducting coil, the power source 16 is brought into a disconnected condition after excitation. A bobbin having three kinds of gradient coils 9, 10 and 11 wound thereon is disposed inside the electromagnet. These gradient coils 9, 10 and 11 are respectively driven by coil drivers 12, 13 and 14 to provide gradients along x, y and z directions to the intensity of the static magnetic field. The field gradients in the x, y and z directions are generated in pulse forms at a predetermined procedure in accordance with control outputs from a controller 1 to the coil drivers 12, 13 and 14. An RF coil 4 is disposed inside the gradient coils. An RF pulse generator 2 is controlled by the controller 1 to generate an RF pulse signal having a specified envelope which in turn is supplied through an amplifier 3 to the RF coil 4. A human body 17 to be inspected lay stretched on a bed 18 and is inserted inside the RF coil 4. An RF magnetic field is generated from the RF coil 4 by the RF pulse signal. An NMR signal received by the RF coil 4 is detected by a phase sensitive detector 6, is sampled by an A/D converter 7 and is then collected into a data processor 8. The data processor 8 performs an image reconstruction processing to convert the collected signals or data into an image. The data processor 8 is provided with a fast Fourier transformer which Fourier-transforms the A/D converted data at a high speed. A memory 21 is used for storing data before Fourier transformation and data after Fourier transformation. Further, image data obtained by the image reconstruction processing is converted by a display 22 into an image.

Next, a measurement sequence used in an embodiment of the present invention will be explained by virtue of FIGS. 3A to 3E. FIGS. 3A to 3E show an example of a pulse sequence for realizing a three-dimensional imaging by a flash method. More especially, FIG. 3A shows the waveform of an RF magnetic field, FIGS. 3B, 3C and 3D show changes in magnitude of field gradients $G_z$, $G_x$ and $G_y$ along z, x and y directions and FIG. 3E shows a sampling period of an NMR signal or a signal acquisition period. The magnitude of gradient in FIGS. 3B, 3C and 3D is represented with a positive gradient shown upside and a negative gradient shown downside. The field gradient $G_z$ generated in a period of time $t_a$ is a first phase encoding field gradient the magnitude of which takes one of a plurality of prepared magnitudes of gradient (inclusive of zero gradient). The field gradient $G_x$ generated in a period of time $t_b$ is a second phase encoding field gradient the magnitude of which takes one of a plurality of prepared magnitudes of gradient (inclusive of zero gradient). The pulse sequence shown in FIGS. 3A to 3E is proposed by the German Patent Application P3504734.8 and brief reference to the operation thereof will now be made. First, the RF pulse and the field gradient $G_z$ are applied at the same time to excite spins in a limited region in the z direction. A spin flip angle $\alpha$ is selected to a value smaller than 90° for the saving of a spin recovering time. Next, phase encodes in the x and z directions are made by the field gradient $G_x$ and $G_z$ respectively to provide information of the locations along the x and z directions to the phase of spins. The read-out of a signal is effected in a period of time $t_c$ under application of the field gradient $G_y$ which provides information of the location along the y direction.

In the present embodiment, there is obtained an image including grid points (or pixels) the number of which is l, m and n in the x, y and z directions, respectively. For this purpose, it is required that the magnitude of gradient $G_z$ in the period of time $t_a$ in FIG. 3 is altered n times, the magnitude of gradient $G_x$ in the period of time $t_b$ is altered l times and the pulse sequence of FIGS. 3A to 3E is repeated for all combinations of the magnitudes of $G_z$ and the magnitudes of $G_x$ or l×n combinations thereof. The number of signal sampling points in the period of time $t_c$ is 2m in each repetition of measurement. Data trains thus acquired are subjected to three-dimensional Fourier transformation to obtain a three-dimensional image.

Figure 1:
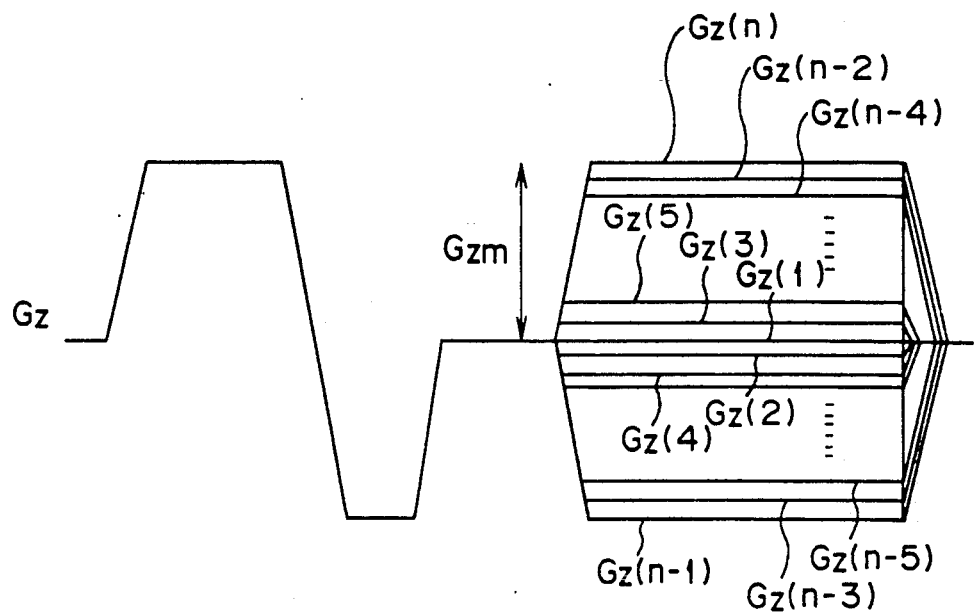
FIG. 1 shows waveforms illustrating the order of alterations in magnitude of a field gradient according to an embodiment of the present invention.

What is peculiar to the embodiment of the present invention is the order of alterations in magnitude of phase encoding field gradients in the repetition of the pulse sequence. First, measurement is repeated l times, selecting a specified one of the magnitudes of gradient $G_z$ while altering the magnitude of gradient $G_x$ l times. The order of alterations in magnitude of gradient $G_x$ may be arbitrary. In general, the magnitude of gradient $G_x$ is altered at the order of magnitudes toward a negative direction from the maximum magnitude in positive gradient down to the maximum magnitude in negative gradient or toward a positive direction from the maximum magnitude in negative gradient up to the maximum magnitude in positive gradient. Subsequently, such measurement over l times is repeated for each of the magnitudes of gradient $G_z$. On the other hand, the order of alterations in magnitude of gradient $G_z$ is established as shown in FIG. 1. In FIG. 1 showing in an enlarged form the waveform of the field gradient $G_z$ in FIG. 3, the order for selection of magnitudes of phase encoding field gradient $G_z$ in the period of time $t_c$ is indicated in parenthesis as by $G_z(1)$, $G_z(2)$, ... $G_z(n)$. The k-th magnitude $G_z(k)$ of $G_z$ is represented by $$G_z(k) = \frac{2}{n} G_{zm}(-1)^{k-1}\left[\frac{k}{2}\right] \quad (2)$$

where [x] is the greatest integer which does not exceed x, k indicates the order of alterations in magnitude of gradient, and $G_{zm}$ is the maximum magnitude of gradient $G_z$·$G_z(k)$ represented by the equation (2), when it is written down from k=1 to k=8 in the exclusion of $$\frac{2}{n} G_{zm},$$

takes 0, −1, +1, −2, +2, −3, +3 and −4. Namely, as apparent also from FIG. 1, the phase encoding field gradient $G_z$ is selected starting from zero magnitude and subsequently at the order of magnitudes from the smallest one up to the largest one in the absolute value of magnitude of gradient.

Next, explanation will be explained of a particular procedure of image reconstruction. As apparent from the measurement sequence explained by use of FIGS. 1 and 3, the first measurement is repeated l times while selecting $G_z(1)$ (zero magnitude) for the phase encoding field gradient $G_z$ and altering the magnitude of gradient $G_x$. Since the number of sampling points in the period of time $t_c$ in each repetition of measurement is 2m, l×2m data are obtained. A train of 2m data acquired for each repetition of measurement are subjected to first one-dimensional Fourier transformation in the fast Fourier transformer and are thereafter stored into the memory 21. Namely, each of l trains of 2m data as shown in FIG. 4 is subjected to one-dimensional Fourier transformation in the y direction or the direction of lapse of time for a waveform acquired for once measurement. After the measurement and one-dimensional Fourier transformation over l times have been completed, l×m data stored in the memory 21 are subjected to second one-dimensional Fourier transformation for a train of l data along the x direction, that is, in the direction of alteration in magnitude of gradient $G_x$, as shown in FIG. 5. This one-dimensional Fourier transformation is repeated by the number of data in the y direction or m times. A line connection circuits indicative of data points means that the one-dimensional Fourier transformation is made for data on the line. The reason why the number of data in the y direction subjected to one-dimensional Fourier transformation is charged from 2m in the first one-dimensional Fourier transformation to m in the second one-dimensional Fourier transformation, is that data which are twice as great as the number m of pixels in the y direction are sampled in once measurement in order to prevent folding on the result of the Fourier transformation.

Figure 6:
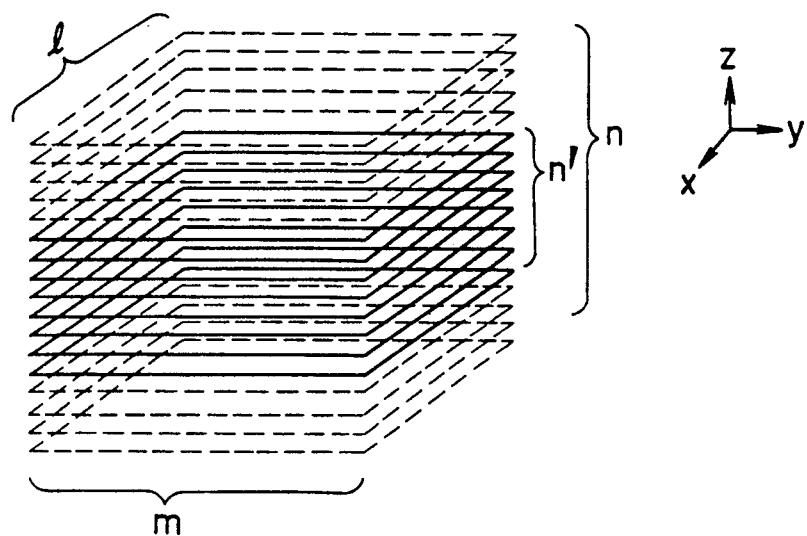

The magnitude of gradient $G_z$ is altered n times at the order of magnitudes from the smallest one $G_z(1)$ to the largest one $G_z(n)$, as has already been mentioned, and measurement is made selecting each of l magnitudes of gradient $G_x$. The Fourier transformations in the y and x directions explained in conjunction with FIGS. 4 and 5 are repeated also for data based on each of the magnitudes of gradient $G_z$ and the results are successively stored into the memory 21. FIG. 6 shows the construction of data stored in the memory 21. Data obtained by two-dimensional Fourier transformation in the x and y directions show a spin distribution along the direction of xy plane. If points on the xy planes are subjected to Fourier transformation in the z-axis direction (or the direction of alteration in magnitude of gradient $G_z$), a three-dimensional image is obtained. Thus, plane (or two-dimensional) data are arranged into the memory 21 at the order of alterations in magnitude of gradient $G_z$ used for measurement, thereby constructing three-dimensional data as shown in FIG. 6. Further, in the present embodiment, at the point of time when measurement and two-dimensional Fourier transformation have been completed for n' magnitudes of gradient $G_z$ which are a part of the n magnitudes of gradient $G_z$, that is, at the point of time when data of n' planes shown by solid lines in FIG. 6 become complete in the memory 21, Fourier transformation in the z direction is performed by the fast Fourier transformer so that the results are stored into another area of the memory 21. When the Fourier transformation in the z direction for all the l×m points has been finished, data of a three-dimensional image having m×l×n' pixels are obtained. The measurement is further continued so that data of n planes including plane data shown by dotted lines in FIG. 6 are ultimately obtained. Also for these data, Fourier transformation in the z direction is performed for all the l×m points, thereby obtaining a three-dimensional image having m×l×n pixels.

In the measurement and image reconstruction according to the above-mentioned procedure, data measured using earlier selected ones among the magnitudes of gradient $G_z$ successively selected contain only lower-frequency components of the spacial frequency in the z direction and data measured using larger magnitudes of gradient $G_z$ later selected contain information of higher spacial frequency. Accordingly, the three-dimensional image obtained by subjecting data of n' planes to Fourier transformation in the z direction has a resolution which is low in the z direction. Therefore, such an image can be called a "crude image" in contrast with a "detailed image" which is obtained by performing the Fourier transformation after all data of n planes have been acquired.

Now, comparison will be made of times required until obtaining images.

It is provided that $m=l=256$, $n=128$, $n'=8$ and a period of time $t_r$ in FIG. 3A (or a time required for once measurement) is 20 milliseconds as a typical value in the flash method. Until acquisition of a final image, a time of about 11 minutes ($=l\times n\times t_r$) is first required as a measurement time. Further, an image reconstruction processing by Fourier transformation requires a time of $(lnT_1+mmT_2+lmT_3)$ in total. Here, $T_1$ is a time required for one-dimensional Fourier transformation of 2m points, $T_2$ a time required for one-dimensional Fourier transformation of l points, and $T_3$ a time required for one-dimensional Fourier transformation of n points. Provided that $T_1=10$ milliseconds, $T_2=5$ milliseconds and $T_3=2.5$ milliseconds, the image reconstruction processing time in total is about 11 minutes. Accordingly, the sum of the measurement time and the processing time will amount to about 22 minutes. However, the Fourier transformations in the y and x directions can be performed during the measurement period of time. As a result, a detailed image is obtained in about 14 minutes after the start of measurement. On the other hand, for acquisition of a crude image, a time of about 41 seconds ($=l\times n'\times T_r$) is first required as a measurement time. Further, an image reconstruction processing requires a time of $(ln'T_1+mn'T_2+lmT_4)$ in total. Here $T_4$ is a time required for one-dimensional Fourier transformation of 8 points and is about 0.16 milliseconds. Accordingly, the image reconstruction processing time in total requires about 41 seconds. In this case, too, the Fourier transformations in the y and x directions can be performed during the measurement period of time. As a result, the crude image can be obtained within one minute after the start of measurement.

The above calculation of the image reconstruction processing time in total has been shown in conjunction with the case where the Fourier transformations in the x, y and z directions are performed by one fast Fourier transformer. If a parallel processing using a plurality of fast Fourier transformers is employed, the processing time is shortened. For example, during a time when Fourier transformation in the x direction for data of one plane is being performed by one fast Fourier transformer, another fast Fourier transformer can perform Fourier transformation in the y direction for data of the next plane.

According to the present embodiment, since a crude image can be obtained in a short time, the judgement of whether or not a measurement condition such as the location of measurement is proper can be made in the course of measurement by displaying the crude image on the display 22. The number of data for reconstruction of the crude image (or the number n' of plane data) may be set to a proper value in accordance with a resolution in the z direction required for the crude image and the degree of high speed required. Further, in the case of a three-dimensional imaging of a human body, a low spacial resolution is usually allowable in a sagital direction of the human body in comparison with a direction of a cross section or slice perpendicular to the sagital direction. In this case, by orienting the human body so that the z direction takes the sagital direction, it is possible not only to make n smaller than l and m, thereby making a time for acquisition of the detailed image as small as possible, but also to further shorten a time for acquisition of the crude image by selecting a very small value for n'.

Figure 7:
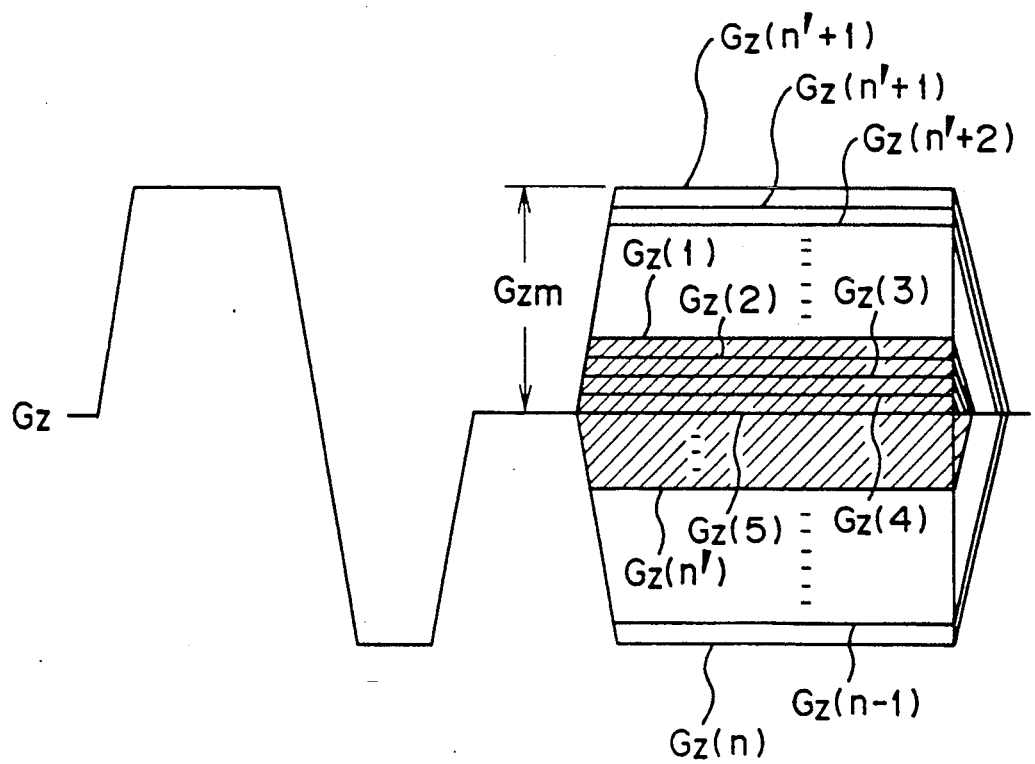
FIG. 7 shows waveforms illustrating the order of alterations in magnitude of a field gradient according to another embodiment of the present invention.

The order of alterations in magnitude of field gradient in the z direction is not limited to the example shown in FIG. 1. FIG. 7 shows another example of the order of alterations in magnitude of field gradient $G_z$ in the z direction. In this embodiment, n' relatively small magnitudes of gradient $G_z$ in a region shown by oblique lines in FIG. 7 are precedently selected among n magnitudes of gradient $G_z$. Selection in the n' magnitude of gradient is made at the order of magnitudes from the largest one in positive gradient down to the largest one in negative gradient. After the n'-th $G_z$ (gradient $G_z(n')$) has been selected, the remaining and relatively large magnitudes of gradient $G_z$ are selected at the order of magnitudes from the maximum magnitude in positive gradient down to the maximum magnitude in negative gradient. The present embodiment is the same as the embodiment of FIG. 1 in that l magnitudes of gradient $G_x$ are successively selected for each magnitude of gradient $G_z$ and hence each magnitude of gradient $G_z$ is selected l times and that one-dimensional transformation in the y direction is performed for each measurement and one-dimensional Fourier transformation in the x direction performed each time the measurement and one-dimensional Fourier transformation in the y direction over l times is finished.

Also in accordance with the order of alterations in magnitude of gradient $G_z$ shown in FIG. 7, two-dimensional data of n' planes necessary for reconstruction of a crude image as shown in FIG. 6 can be precedently obtained and hence the crude image can be obtained in a short time. An indispensable condition is that among all $l\times n$ combinations of n magnitudes of gradient $G_z$ and l magnitudes of gradient $G_x$, a group of $l\times n'$ combinations including magnitudes of gradient $G_z$ not larger than a predetermined magnitude is precedently selected and a group of the remaining $l\times(n-n')$ combinations is selected in later. The order for selection of combinations in each of the two groups may be arbitrary.

The foregoing explanation has been made in conjunction with the embodiments in which a crude image is obtained in a short time by properly establishing the order of alterations in magnitude of phase encoding field gradient. The method according to the present invention is also applicable to the case where data acquired with smaller magnitudes of gradient $G_z$ are selected among measured data and are subjected to Fourier transformation after all of three-dimensional data for obtaining a three-dimensional detailed image have been acquired. More particularly, the measurement sequence shown in FIGS. 3A to 3E is performed in all $l\times n$ combinations of n magnitudes of gradient $G_z$ and l magnitudes of gradient $G_x$. Each time data measurement based on one combination is made, only one-dimensional Fourier transformation in the y direction as shown in FIG. 4 is performed. After the measurement over $l\times n$ times has been completed, three-dimensional data of $m\times l\times n$ points subjected to the Fourier transformation in the y direction are stored in the memory 21. Next, prior to subjecting all of the three-dimensional data to Fourier transformations in the x and z directions to obtain a detailed image, a crude image is obtained using only a part of data. Namely, among two-dimensional data of n planes in the z-axis direction, only two-dimensional data of n' planes based on measurement using the phase encoding field gradient $G_z$ in the z-axis direction the magnitude of which is not larger than a predetermined value are read from the memory 21 and the successively subjected to Fourier transformations in the x and z directions. A time required for the Fourier transformations in the x and z directions is $(mn'T_2+lmT_4)$. Provided that $l=m=256$, $n'=8$, a time $T_2$ necessary for one-dimensional Fourier transformation of 256 points is 5 milliseconds, and a time $T_4$ necessary for one-dimensional Fourier transformation of 8 points is 0.16 milliseconds, an image reconstruction processing can be performed in about 21 seconds. On the other hand, a time of $(mnT_2+mT_3)$ is required for performing Fourier transformations in the x and z directions for all of two-dimensional data of n planes to obtain a detailed image. Provided that n is 128 and a time $T_3$ necessary for one-dimensional Fourier transformation of 128 points is 2.5 milliseconds, a time of about 5.5 minutes is required for an image reconstruction processing. Accordingly, it is possible to rapidly obtain a crude image by selecting only necessary data and Fourier-transforming them. In this case, the order of alterations in magnitude of the phase encoding field gradient may be one employed in the conventional method.

In the foregoing, explanation has been made of various embodiments which obtain a crude image rapidly in the case where a spacially three-dimensional image is to be obtained from an NMR signal. The present invention is not limited to those embodiments. The present invention is applicable to any inspection method in which phase encoding is made for one or more directions. Especially, in a chemical shift imaging described by Journal of Magnetic Resonance, Vol. 51 (1983), pp. 147-152, a phase encoding method which is quite the same as the phase encoding method in the three-dimensional imaging shown in FIG. 3 is employed but information of phase rotation due to chemical shift is obtained for every measurement without applying a readout field gradient. Therefore, measurement over multiple times and Fourier transformation over multiple times based on combinations of a plurality of magnitudes of one of phase encoding field gradient along one of two directions and a plurality of magnitudes of a phase encoding field gradient along the other direction are needed and hence a long time is required for measurement and image reconstruction. Accordingly, if the order of alterations in magnitude of phase encoding field gradient and/or an image reconstruction processing as taught by the present invention are applied to the chemical shift imaging, the effect of the present invention of obtaining a crude image in a short time is greatly demonstrated. Also, in the case of an imaging in which phase encoding is made in two directions, there can be obtained not only a crude the resolution of which is low in only one of the two directions (as in the herein disclosed embodiments) but also a crude image the resolution of which is low in both of the two directions. The latter crude image can be obtained in such a manner that among all combinations of a plurality of magnitudes of gradient prepared for a phase encoding field gradient along one of the two directions and a plurality of magnitudes of gradient prepared for a phase encoding field gradient along the other direction, only the combinations including magnitudes of gradient not larger than a predetermined value are precedently selected and an image reconstruction processing is performed for partial data measured through the selected combinations or in such a manner that among all data, only partial data measured through the above-mentioned combinations including magnitudes of gradient not larger than a predetermined value are selected and are subjected to an image reconstruction processing. It is apparent from the foregoing explanation that the crude image having a resolution deteriorated in both of two directions can be obtained in a further shorter time than the crude image which has a resolution deteriorated in only one direction and is described by virtue of the embodiments.

We claim:

1. A nuclear magnetic resonance imaging method of obtaining an image from nuclear magnetic resonance signal derived from an object placed in a space to which a predetermined static magnetic field is applied, comprising:
   (a) a step of exciting nuclear spins in said space;
   (b) a step of applying a phase encoding field gradient along at least one direction to said static magnetic field to provide information of the location along said direction to the phase of excited nuclear spins, said phase encoding field gradient being applied with one of a plurality of magnitudes of gradient prepared for said phase encoding field gradient;
   (c) a step of measuring a resonance signal of said nuclear spins;
   (d) a step of repeating said steps (a) to (c) while successively selecting, among the plurality of magnitudes of gradient prepared for said phase encoding field gradient, magnitudes of gradient which belong to a first group of magnitudes of gradient not larger than a predetermined value;
   (e) a step of performing an image reconstruction processing based on Fourier transformation for data trains acquired by said step (d), thereby obtaining a crude image;
   (f) a step of repeating said steps (a) to (c) while successively selecting, among the plurality of magnitudes of gradient prepared for said phase encoding field gradient, magnitudes of gradient which belong to a second group of magnitudes of gradient exceeding said predetermined value; and
   (g) a step of performing an image reconstruction processing based on Fourier transformation for all of data trains acquired through the whole of the repetition in said step (d) and the repetition in said step (f), thereby obtaining a detailed image.

2. A nuclear magnetic resonance imaging method of obtaining an image from nuclear magnetic resonance signal derived from an object placed in a space to which a predetermined static magnetic field is applied, comprising:
   (a) a step of exciting nuclear spins in said space;
   (b) a step of applying a phase encoding field gradient along at least one direction to said static magnetic field to provide information of the location along said direction to the phase of excited nuclear spins, said phase encoding field gradient being applied with one of a plurality of magnitudes of gradient prepared for said phase encoding field gradient;
   (c) a step of measuring a resonance signal of said nuclear spins;
   (d) a step of repeating said steps (a) to (c) while selecting the plurality of magnitudes of gradient prepared for said phase encoding field gradient at the order of magnitudes from a smaller one toward a larger one;
   (e) step of performing an image reconstruction processing based on Fourier transformation for data trains acquired before the completion of repetition of by said step (d), thereby obtaining a crude image; and (f) a step of performing an image reconstruction processing based on Fourier transformation for all of data trains acquired until the completion of repetition of measurement by said step (d), thereby obtaining a detailed image.

3. A nuclear magnetic resonance imaging method of obtaining an image from a nuclear magnetic resonance signal derived from an object placed in a space to which a predetermined static magnetic field is applied, comprising:

(a) a step of exciting nuclear spins in said space;

(b) a step of applying a phase encoding field gradient along at least one direction to said static magnetic field to provide information of the location along said direction to the phase excited nuclear spins, said phase encoding field gradient being applied with one of a plurality of magnitudes of gradient prepared for said phase encoding field gradient;

(c) a step of measuring a resonance signal of said nuclear spins;

(d) a step of repeating said steps (a), (b) and (c) while successively selecting the plurality of magnitudes of gradient prepared for said phase encoding field gradient;

(e) a step of performing an image reconstruction processing for data trains which are a part of data trains acquired through the repetition of measurement by said step (d) and correspond to the selection of those ones of the plurality of magnitudes of gradient prepared for said phase encoding field gradient which include magnitudes of gradient not larger than a predetermined value, thereby obtaining a crude image; and (f) a step of performing an image reconstruction processing for all of the data trains acquired through the repetition of measurement by said step (d), thereby obtaining a detailed image.

4. A nuclear magnetic resonance imaging method of obtaining an image from a nuclear magnetic resonance signal derived from an object placed in a space to which a predetermined static magnetic field is applied, comprising:

(a) a step of exciting nuclear spins in said space;

(b) a step of applying first and second phase encoding field gradients along first and second directions of said space to said static magnetic field to provide information of the locations along said first and second directions to the phase of excited nuclear spins, each of said first and second phase encoding field gradients being applied with one of a plurality of magnitudes of gradient prepared for that phase encoding field gradient;

(c) a step of measuring a resonance signal of said nuclear spins;

(d) a step of repeating said steps (a) to (c) while successively selecting, among all combinations of the plurality of magnitudes of gradient prepared for said first phase encoding field gradient and the plurality of magnitudes of gradient prepared for said second phase encoding field gradient, combinations in a first group in which the magnitude of said first phase encoding field gradient is not larger than a predetermined value;

(e) a step of performing a first image reconstruction processing for data trains acquired by said step (d), thereby obtaining a crude image;

(f) a step of repeating said steps (a) to (c) while successively selecting, among said all combinations, combinations in a second group in which the magnitude of said first phase encoding field gradient exceeds said predetermined value; and (g) a step of performing a second image reconstruction processing for data trains acquired through the whole of the repetition in said step (d) and the repetition in said step (f), thereby obtaining a detailed image.

5. A nuclear magnetic resonance imaging method according to claim 4, wherein the measurement of the resonance signal in said step (c) is made under the presence of a read-out field gradient along a third direction of said space.

6. A nuclear magnetic resonance imaging method according to claim 4, wherein the order for successive selection of the combinations in each of said steps (d) and (f) is such that the plurality of magnitudes of gradient prepared for said second phase encoding field gradient are successively selected while continually and repetitively selecting a specified one of the magnitudes of gradient for said first phase encoding field gradient and the successive selection of the magnitudes of said second phase encoding field gradient is repeated while altering the magnitude of said first phase encoding field gradient which is continually selected.

7. A nuclear magnetic resonance imaging method according to claim 6, wherein first Fourier transformation along a direction of lapse of time of said resonance signal is performed each time the repetition of said steps (a) to (c) based on the selection of one combination of magnitudes of gradient in each of said steps (d) and (f) is finished, second Fourier transformation along a direction of successive alteration in magnitude of said second phase encoding field gradient is performed each time the successive selection of the plurality of magnitudes of gradient prepared for said second phase encoding field gradient in combination with one of the plurality of magnitudes of gradient prepared for said first phase encoding field gradient is finished, and each of said first and second image reconstruction processings includes performing third Fourier transformation along a direction of successive alteration in magnitude of said first phase encoding field gradient for data trains for which said first Fourier transformation and said second Fourier transformation have been performed.

8. A nuclear magnetic resonance imaging method according to claim 4, wherein the number of the magnitudes of gradient prepared for said first phase encoding field gradient is smaller than the number of the magnitudes of gradient for prepared for said second phase encoding field gradient.

9. A nuclear magnetic resonance imaging method of obtaining an image from a nuclear magnetic resonance signal derived from an object placed in a space to which a predetermined static magnetic field is applied, comprising:

(a) a step of exciting nuclear spins in said space;

(b) a step of applying first and second phase encoding field gradients along first and second directions of said space to said static magnetic field to provide information of the locations along said first and second directions to the phase of excited nuclear spins, each of said first and second phase encoding field gradients being applied with one of a plurality of magnitudes of gradient prepared for that phase encoding field gradient;

(c) a step of measuring a resonance signal of said nuclear spins;

(d) a step of repeating said steps (a) to (c) while successively selecting the plurality of magnitudes of gradient prepared for said second phase encoding field gradient and continually selecting one of the plurality of magnitudes of gradient prepared for said first phase encoding field gradient;

(e) a step of repeating said step (d) while selecting the plurality of the magnitudes of gradient prepared for said first phase encoding field gradient at the order of magnitudes from a smaller one toward a larger one;

(f) a step of performing a first image reconstruction processing for data trains acquired before the completion of repetition in said step (e), thereby obtaining a crude image; and (g) a step of performing a second image reconstruction processing for all of data trains acquired until the completion of repetition in said step (e), thereby a detailed image.

10. A nuclear magnetic resonance imaging method according to claim 9, wherein the measurement of the resonance signal in said step (c) is made under the presence of a read-out field gradient along a third direction of said space.

11. A nuclear magnetic resonance imaging method according to claim 9, wherein first Fourier transformation along a direction of lapse of time of said resonance signal is performed each time the measurement in said step (c) is finished, second Fourier transformation along a direction of alteration in magnitude of said second phase encoding field gradient is performed each time the repetition of measurement by said step (d) is finished, an each of said first and second image reconstruction processings includes performing third Fourier transformation along a direction of alteration in magnitude of said first phase encoding field gradient.

12. A nuclear magnetic resonance imaging method according to claim 9, wherein the number of the magnitudes of gradient prepared for said first phase encoding field gradient is smaller than the number of the magnitudes of gradient for prepared for said second phase encoding field gradient.

13. A nuclear magnetic resonance imaging method of obtaining an image from a nuclear magnetic resonance signal derived from an object placed in a space to which a predetermined static magnetic field is applied, comprising:

(a) a step of exciting nuclear spins in said space;

(b) a step of applying first and second phase encoding field gradients along first and second directions of said space to said static magnetic field to provide information of the locations along said first and second directions to the phase of excited nuclear spins, each of said first and second phase encoding field gradients being applied with one of a plurality of magnitudes of gradient prepared for that phase encoding field gradient;

(c) a step of measuring a resonance signal of said nuclear spins;

(d) a step of repeating said steps (a) to (c) while successively selecting all combinations of the plurality of magnitudes of gradient prepared for said first phase encoding field gradient and the plurality of magnitudes of gradient prepared for said second phase encoding field gradient;

(e) a step of performing a first image reconstruction processing for data trains which are a part of data trains acquired through the whole of the repetition of measurement by said step (d) and correspond to the selection of those ones of the plurality of magnitudes of gradient prepared for said first phase encoding field gradient which include magnitudes of gradient not larger than a predetermined value, thereby obtaining a crude image; and (f) a step of performing a second image reconstruction processing for all of the data trains acquired through whole of the repetition of measurement by said step (d), thereby obtaining a detailed image.

14. A nuclear magnetic resonance imaging method according to claim 13, wherein the measurement of the resonance signal in said step (c) is made under the presence of a read-out field gradient along a third direction of said space.

15. A nuclear magnetic resonance imaging method according to claim 13, wherein the number of the magnitudes of gradient prepared for said first phase encoding field gradient is smaller than the number of the magnitudes of gradient for prepared for said second phase encoding field gradient.

* * * * *